United States Patent [19]

Ooe et al.

[11] Patent Number: 4,891,773
[45] Date of Patent: Jan. 2, 1990

[54] LOGIC SIMULATION

[75] Inventors: Kimio Ooe, Kawasaki; Nobutaka Amano, Tokyo; Takashige Kubo, Hachioji; Kaoru Moriwaki, Hadano, all of Japan

[73] Assignees: Hitachi, Ltd.; Hitachi Microcomputer Engineering Ltd., both of Tokyo, Japan

[21] Appl. No.: 42,233

[22] Filed: Apr. 24, 1987

[30] Foreign Application Priority Data

Apr. 25, 1986 [JP]   Japan .................................. 61-94545

[51] Int. Cl.$^4$ ........................ G06F 15/20; G06F 11/22
[52] U.S. Cl. .................................... 364/578; 364/490; 371/23
[58] Field of Search ................ 364/488, 489, 490, 491, 364/578, 200, 900; 371/20, 23, 25

[56]   References Cited

U.S. PATENT DOCUMENTS

| | | | |
|---|---|---|---|
| 4,306,286 | 12/1981 | Cocke et al. | 364/200 |
| 4,342,093 | 7/1982 | Miyoshi | 364/578 |
| 4,527,249 | 7/1985 | Van Brunt | 364/578 |
| 4,587,625 | 5/1986 | Marino, Jr. et al. | 364/578 |
| 4,590,581 | 5/1986 | Widdoes, Jr. | 364/578 |
| 4,644,487 | 2/1987 | Smith | 364/578 |

Primary Examiner—Felix D. Gruber
Attorney, Agent, or Firm—Antonelli, Terry & Wands

[57]   ABSTRACT

In a logic simulation method for performing logic simulation of a logic circuit including a circuit with unknown internal logic, the circuit itself with the unknown internal logic is used. The internal status of the circuit is set at an objective status using the interrupt operation afforded by the circuit and thereafter, input signal value is applied to the circuit to obtain a resultant output. For other logic circuits without unknown internal logic, software logic simulation is performed. During such software logic simulation, the actual circuit with unknown internal logic is called.

4 Claims, 4 Drawing Sheets

LOGIC SIMULATION

BACKGROUND OF THE INVENTION

1. Field of the Invention

The present invention relates to logic simulation for a printed circuit board unit mounted with such a device as a microprocessor whose internal logic is not known, an LSI or others.

2. Description of the Related Arts

A method of obtaining test data of a device mounted on a printed circuit board unit whose internal logic is not known, by using the device itself, is described, for example, in JP-A-56-2046. According to this method, an emulator using the actual device itself is provided as a software fault simulator to operate the emulator with its input and output correlated with each other so that test data can be obtained. However, in logic simulation, if signals applied to the input pins of an LSI whose internal logic is not known change during simulation procedure, the corresponding output signals are required every time such a change occurs. Thus, this method is not available for logic simulation.

The detail of the internal logic of an LSI is not known in most case except for custom LSI's designed at its own factory. It is difficult to deduce the internal structure of a large scale microprocessor based on its function, and even if it is possible it remains no better than deduction.

As a logic simulation method for a logic circuit including an LSI whose internal logic is not known, there is a method of describing the function of an LSI by using software. According to this method, since the function and operation of an LSI is known although the internal logic is not available, the function and operation is logically expressed and defined to operate the LSI using the software and obtain an expected output data for a certain input data. With this method, it is necessary to use a different definition of function and operation for each type of LSI's whose internal logic are not known. Particularly, in case of an LSI which is designed to perform complicated function, such definition work as well as development effort for behavioral description language requires highly sophisticated knowledge and skill, and takes a long time, resulting in a very difficult work. Further, it is necessary to confirm that the output value from the software model is consistent with that of the actual LSI. Therefore, debug work for this software model requires an extremely long time.

In an alternative logic simulation method, an LSI itself whose internal logic is not known is positively used. The objective LSI is connected to a computer system performing software logic simulation via an I/O device. When the signal values to the LSI change during a logic simulation procedure, the LSI is called in a similar manner to the case of a call subroutine to transfer the corresponding output signals to the software logic simulator. Thus, logic simulation is performed for a logic circuit including logical elements whose internal logic are not known.

In such a logic simulation using an actual device, it is necessary to consider timings between hardware and software. Particularly in the case of an LSI using dynamic MOS circuits, the internal circuits thereof are not operable without a minimum operating speed. Therefore, data transfer from the software to the actual device may become insufficient without considering this minimum operating speed. To solve this problem, there is known a method wherein all the input signal values to the LSI are saved as a history from the start of logic simulation, and every time the actual device is called in accordance with software logic simulation, the history and a new input value are sequentially executed at a higher speed than the minimum operation speed to obtain the corresponding outputs. With this method, although the minimum operating speed is ensured, since the history from the start of logic simulation must be executed every time the actual device is called, a long time in simulation and hence in execution of the history is required and the memory capacity must be increased.

SUMMARY OF THE INVENTION

It is an object of the present invention to provide a logic simulation method and apparatus capable of performing logic simulation of a device whose internal logic is not known, by using the device itself.

To achieve the above object, the aspect of the present invention resides in that in a case where an objective LSI is a microprocessor or the like, the internal status is saved using an interrupt operation of the microprocessor or the like, and the internal status is recovered when the actual device is called, to thereby enable the obtaining of the same result as that obtained by setting the internal status by executing the history from the start of logic simulation.

DESCRIPTION OF THE PREFERRED EMBODIMENT

The present invention will be described in detail with reference to the accompanying drawings.

Figure 1:
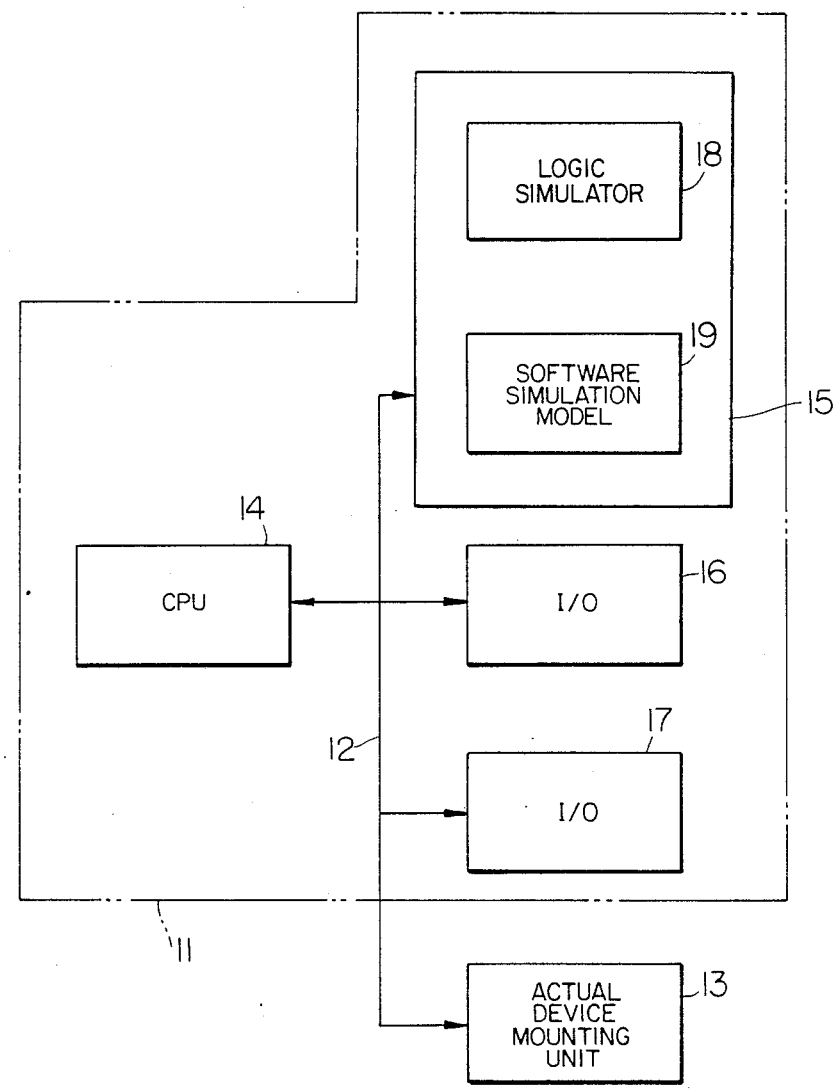
FIG. 1 is a block diagram showing an embodiment of the structure of a computer system according to the present invention.

FIG. 1 is a block diagram showing an embodiment of the structure of a computer system according to the present invention. The computer system 11 is constructed of a CPU 14, a memory 15 and a desired number of I/O channels 16, 17, with a data bus 12 interconnected among them. The computer system 11 is also connected to an actual device mounting unit 13 via the data bus 12. The computer system 11 can operate upon conventional software logic simulation. Thus, a logic simulator 18 and a logic circuit model 19 to be simulated are stored in the main storage 15 of the computer system 11. Similar to a call subroutine, the actual device mounting unit 13 is called by a software logic simulator on the computer system 11 via the I/O channels 16, 17, and receives input signal values from the CPU 14 and sends output signal values to the CPU 14.

Figure 2:
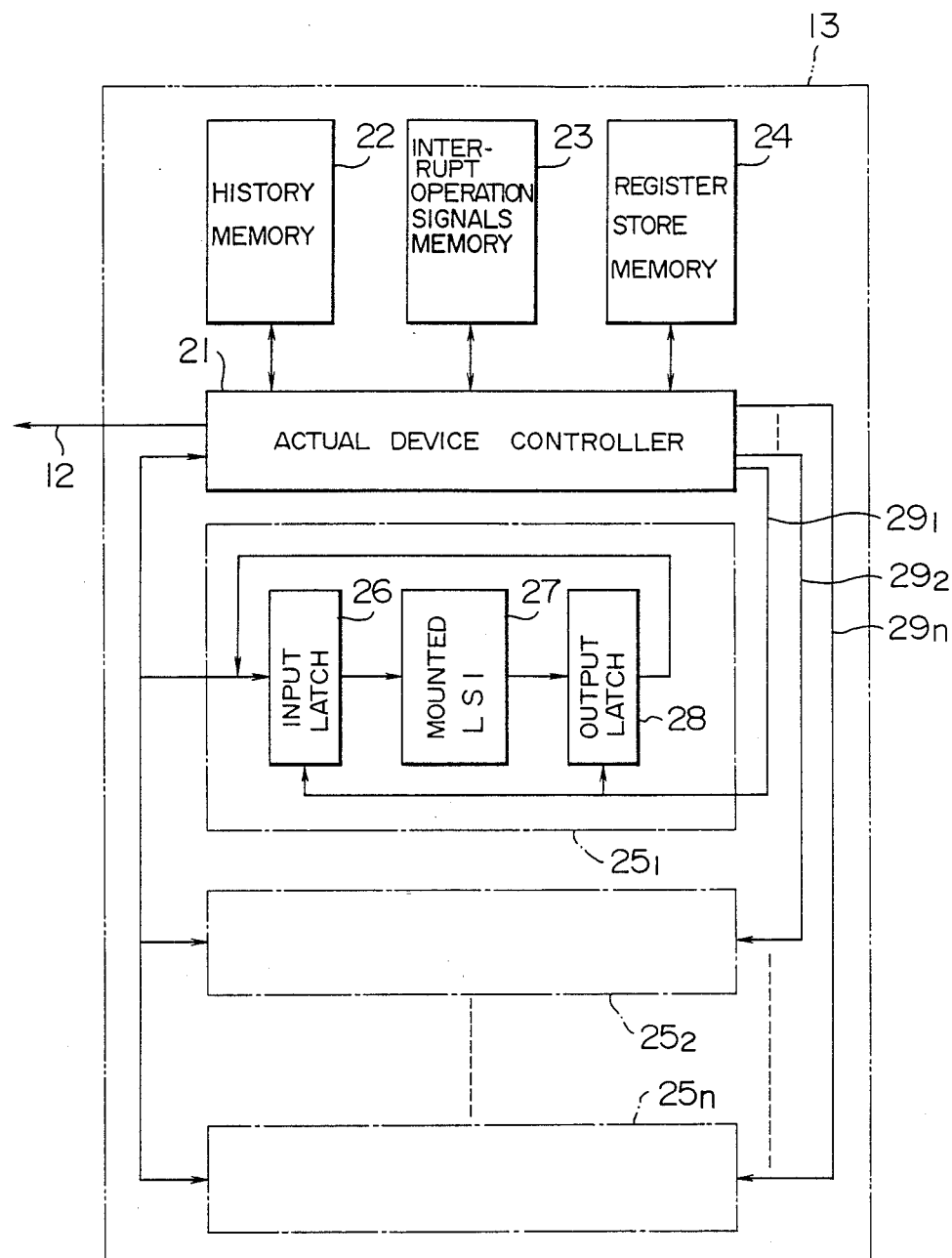
FIG. 2 is a block diagram showing an embodiment of the structure of an actual device mounting unit apparatus according to the present invention.

FIG. 2 is a block diagram showing an embodiment of the actual device mounting unit 13 according to the present invention. Input signal values sent from the CPU to the actual device mounting unit 13 is transferred to a history memory 22 via an actual device controller 21 to update the contents thereof. The actual device mounting unit 13 generally has many actual device mounting submodules $25_1$-$25_n$ each of which holds one of LSI's used in a circuit whose operation is to be simulated. The submodules $25_i(i=1, 2, \ldots n)$ can be selected upon upon a selection signal $29_i(i=1, 2, \ldots n)$ from the actual device controller. Each submodule $25_i$ ($i=1, 2, \ldots$ or n). has an input latch 26 and an output latch 28 connected to the input and output terminals of a mounted LSI 27, respectively. Input signals required for interrupt operation of each mounted LSI 27 are transferred prior to execution of simulation to interrupt operation signals memory 23. The mounted LSI 27 is driven by input signals to execute an interrupt operation so that the contents of internal registers of the mounted LSI 27 may be saved in and restored from a register store memory 24. The internal registers of the mounted LSI in the designated actual device mounting submodule are set upon an interrupt operation, and the input signals in the history memory 22 is applied to the mounted LSI via the input latch to drive the mounted LSI. The obtained output data of the mounted LSI 27 is saved in the output latch 28. The input signal in the output latch 28 is transferred to the CPU via the actual device controller 21.

The operating relation between the software logic simulator and the actual device mounting unit is described.

First, a good LSI which can operate correctly is required to be mounted on the actual device mounting unit before the simulation.

Secondly, an adapter which interconnects the mounted good LSI terminals and the input and output latches is prepared so as to exchange information between the LSI and the input and output latches.

Thirdly, input signals necessary for interrupt operation of the LSI are prepared.

Lastly, logic circuits information necessary for logic simulation is prepared.

Detailed explanation will be made as to the save and restore or recover operations of the contents of the internal registers utilizing the interrupt operation, which is the feature of the present invention.

At first, interrupt input series necessary for the interrupt operation of the LSI 27 are prepared in the computer system 11.

Input series constituted by signal values DATA BUS, INTERRUPT and CLOCK signals which are necessary for the interrupt operation are prepared in an interrupt input series memory 23. Two kinds of the interupt input series are prepared, one for the saving, and the other for recovering of the internal registers of the LSI 27.

The interrupt input series for the register saving are comprised of input signals necessary for recording the contents of an accumulatoi-ACC, a program counter PC, a status register SR, a stack pointer SP, etc. in a register recording memory 24. The saving operation of the contents of the internal registers of LSI 27 will be explained as follows.

The first set of signal values of the input series is fetched from the interupt input series memory 23.

The fetched set is inputted to the LSI 27 via the input latch 26.

The output of the LSI 27 is latched by the output latch 28.

When the LSI 27 outputs an address for storing the contents of the registers to be saved, the contents of the registers are stored at the corresponding address of the register recording memory 24.

To save all of the contents of the internal registers, processing of above steps is continued until all of the interrupt input series are used.

Contrary to the interrupt input series for the register saving, the interrupt input series for the register recovering are prepared for recovering the contents of the internal registers stored in the register recording memory 24 into the internal registers of the LSI 27. Namely, an instruction for returning the state at the occurrence of the interrupt is inserted after the input series for series memory 23. The recovery operation of the contents of the internal registers of the LSI 27 by an interrupt operation will be explained as follows.

The first set of signal values of the interrupt input series is fetched from the interrupt input series memory 23.

When the contents of registers are fetched from the register recording memory 24, the fetched set and the contents of the registers are combined.

The combined information is inputted to the LSI 27 via the input latch 26.

The output of the LSI 27 is latched by the output latch 28.

When the LSI 27 outputs and address at which the saved contents of the registees are stored, the corresponding contents of the registers are fetched from the register recording memory 24.

To recover all of the contents of the internal registers, processing of the above steps is repeated until the interrupt input series are exhausted.

In general, the interrupt operation by a microprocessor or the like can commence only at a moment between bus cycles each of which corresponds to the period of an instruction of the microprocessor. Thus, the help of the history memory is needed during a bus cycle in the present invention. The logic simulation in the present invention using the interupt recovery operation and the history memory in common will be explained as follows.

When the signal change is generated at the clock pin in the software logic simulation 18, a set of signal values comprised of clock signal, data signal and the like is transferred to the actual device mounting unit 13.

The actual device mounting unit 13 recovers the contents of the internal registers of the LSI 27, which contents were previously saved in a prior step.

More specifically, the interrupt input series for the register recovering are successively read out from the interrupt input series memory 23, and inputted to the LSI 27. The LSI 27 is interrupted to save the contents of the internal registers. However, the contents to be saved are unnecessary to record.

Similarly, the input signal values corresponding to the Return from Interupt instruction RTI are inputted to the LSI 27.

The LSI 27 recovers the contents of the internal registers, at which the contents previously saved are set to the internal registers of the LSI 27.

Subsequently, the sets of signal values of the input series stored in the history memory after are successively inputted to the LSI 27.

The output results of the LSI 27 corresponding to the new set of signal values are latched, and sent to the logic simulator 18.

If there comes a junction of the bite cycles, the LSI 27 starts the interrupt operation by the actual device controller 21, that is, starts the saving operation of the internal registers by the interrupt operation. Thus, the contents of the internal registers are stored in the register recording memory 24.

Figure 3:
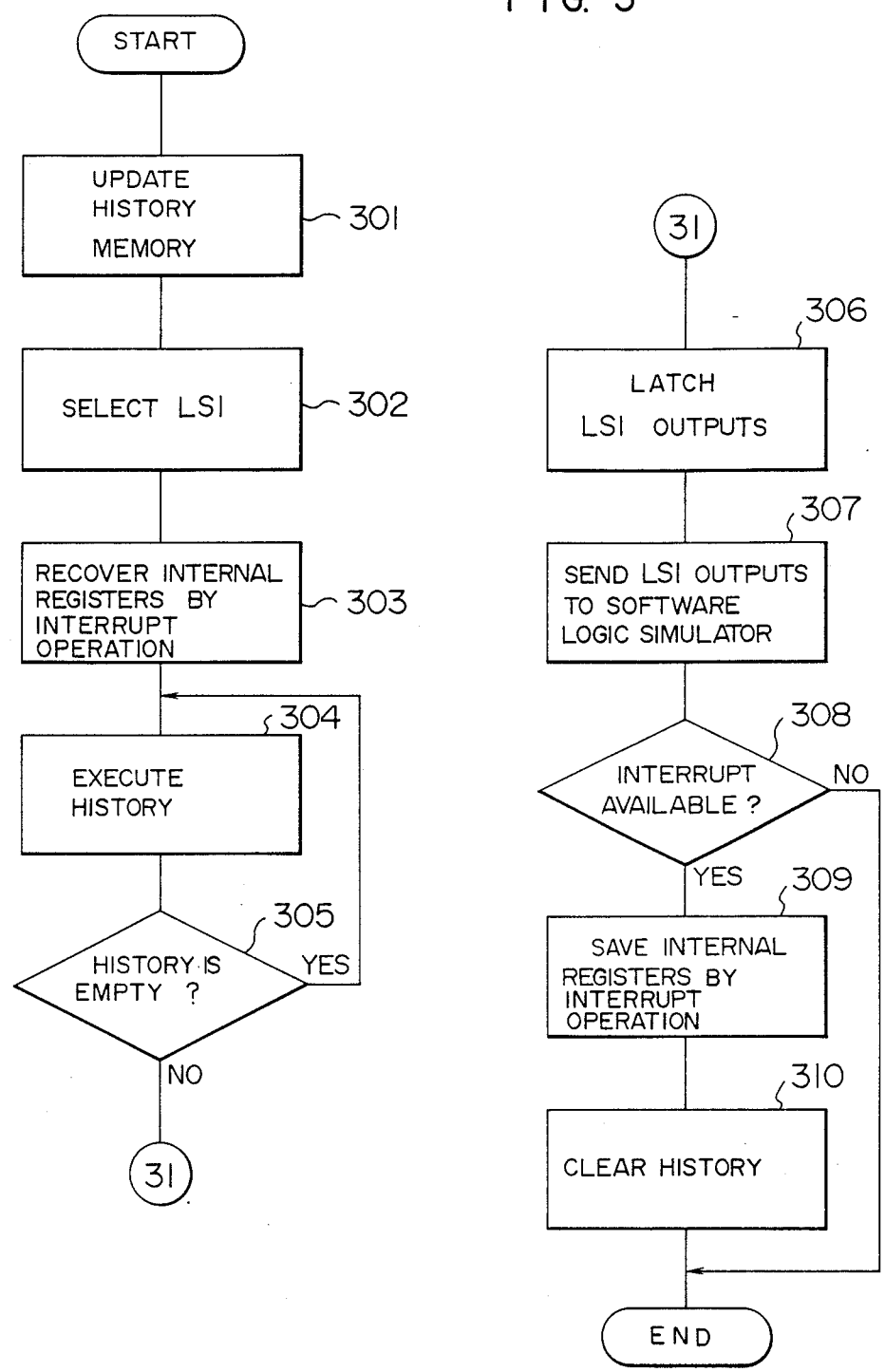
FIG. 3 is a flow chart illustrating the operation of the actual device mounting unit.

Further, the process flow of the logic simulation method according to the present invention will be described with reference to FIG. 3.

Similar to the prior art simulation method, software logic simulation on the computer system 11 sets up appropriate initial signal values for all signals of all logic circuits formed on CPU 14. The actual device of LSI on the actual device mounting unit 13 is also initialized, if necessary, upon supply of suitable initializing signals.

(2) Logic simulation using software is performed in a conventional manner. When input pin data to the LSI on the actual device mounting unit changes, the CPU 14 calls the actual device mounting unit 13 in a similar manner to the case of a subroutine call to thereby transfer the input pin data and the mounted LSI select data to the actual device mounting unit 13.

(3) The input signal value to the actual device mounting unit 13 is sent to the history memory 22 via the actual device controller 21 to update the contents of the memory (step 301).

(4) An actual device mounting submodule (e.g., 25₁) is selected in accordance with the mounted LSI select data at the actual device mounting unit 13 (step 302).

(5) An interrupt operation is executed using input signals from the interrupt operation signals memory 23 to recover the previous contents of the internal registers of the mounted LSI 27 stored in the register store memory 24 and load them into the mounted LSI 27 (step 303).

(6) Input signal in the history memory 22 is picked up one signal after another to sequentially drive the mounted LSI 27 through the input latch 26 (steps 304, 305).

(7) After executing the last signal in the history memory, the resultant outputs from the mounted LSI 27 are latched at the input latch 28 after a proper delay time (step 306).

(8) The resultant outputs from the output latch 28 are sent to the CPU 14 as the outputs of the mounted LSI 27. The software logic simulator continues logic simulation using the data thus obtained from the actual device mounting unit (step 307).

(9) Then, signals for interrupt operation, if possible, are sent from the interrupt operation signals memory 23 to the mounted LSI 27 to store the contents of the internal registers of the mounted LSI 27. An interrupt operation is available only at the end of one instruction. If an interrupt operation is not available, the internal registers are set up using the contents of the internal registers at the previous interrupt operation and the history obtained thereafter, (steps 308, 309).

(10) After storing the contents of the internal registers, the contents of the history memory 22 now unnecessary are cleared (step 310).

Next, the save and recovery of the internal registers of the mounted LSI 27 by the interrupt operations at (5) and (9) will be described in detail.

A minimum operating speed of an LSI using MOS dynamic circuit such as a microprocessor must be ensured to obtain normal operating conditions of the internal circuits, as previously described. However, if the contents of the internal registers can be stored and recovered, the internal status at the time when the contents of the internal registers were stored can be restored without repeating the history from the start of logic simulation. A microprocessor is usually provided with an interrupt function. During an interrupt operation, the microprocessor saves the contents of the internal registers to main storage and thereafter, an interrupt routine is executed which is indicated by the interrupt vector located at an address specific to the microprocessor. By executing return instruction from the interrupt routine, the contents of the internal registers saved previously are restored to resume the process.

The present invention is featured in that the contents of the internal registers are stored and recovered by the interrupt operation. Particularly, when an input signal value is sent from the software simulator, the contents of the internal registers (saved by the previous interrupt operation) are restored. Next, the input signal value is supplied. After a certain time elapses, the output signal of the LSI are latched. Thereafter, another interrupt operation is again initiated to save the contents of the internal registers at that time.

An interrupt operation is usually available only at the end of a bus cycle. Therefore, during the bus cycle, the history of input pin data becomes necessary. However, only the short history is required, because an average of 10 machine cycles at most necessary to execute an instruction of most recently available microprocessors. The previous history becomes unnecessary each time the contents of the internal registers are stored by an interrupt operation. As a result, the contents of the internal registers can be set at high speed.

Next, a concrete example is described below with reference to FIG. 4. The save operation of the internal registers when (n)-th input signal value at the end of bus cycle is sent from the software simulator and the recovery operation when (n+1)-th input signal value is sent, will be described in detail with reference to FIG. 4.

Figure 4:
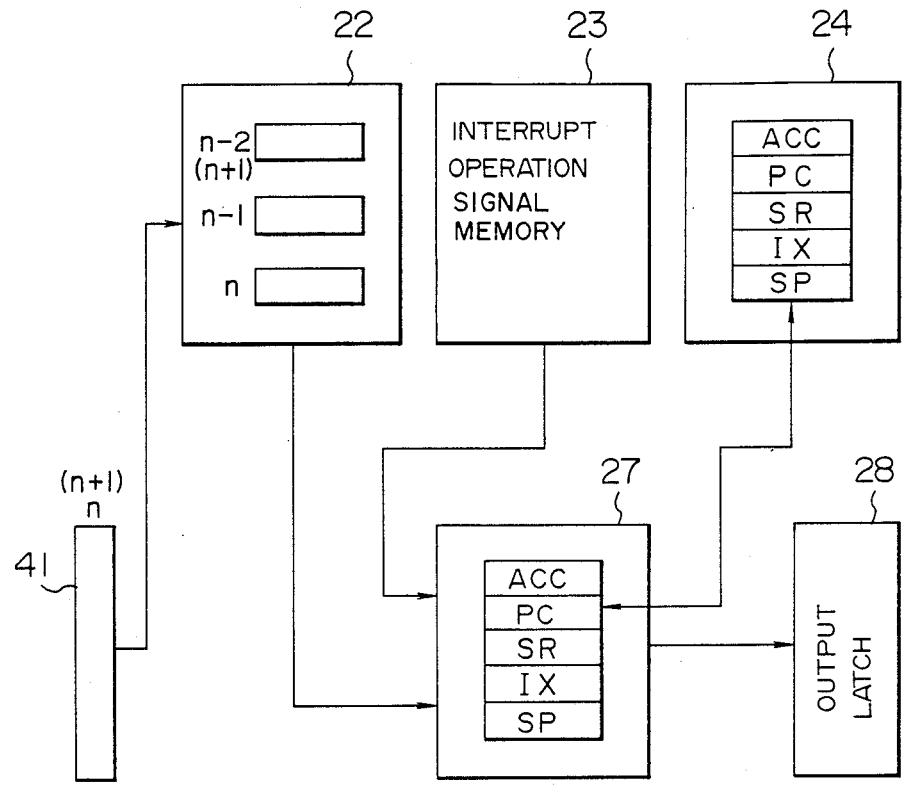
FIG. 4 is a schematic view used for explaining the internal status save and recovery during an interrupt operation.

Referring to FIG. 4, the (n)-th input signal value sent from the software simulator to the LSI updates the contents of the history memory 22. Next, the mounted LSI 27 is sequentially driven using the previous (n−2)-, (n−1)-and (n)-th input signal value and the results are stored in the output latch 28.

Assume that the (n)-th input signal value is obtained at the end of instruction cycle. An interrupt operation of the mounted LSI 27 starts upon application of input signals necessary for the interrupt operation from the interrupt operation signals memory 23. Then, the contents of the internal registers of the mounted LSI 27, such as accumulator ACC, a program counter PC, a status register SR, an index register IX and a stack pointer SP are saved in the register store memory 24. For those registers whose contents cannot be saved using an interrupt operation, another input signal pattern such as a store instruction is supplied from the interrupt operation signals memory 23 to thus save the contents of all the internal registers. After saving the contents of the internal registers, the input signal value up to the (n)-th input signal value and the internal status of mounted LSI 27 become unnecessary so that they are cleared or reset.

Next, when the (n+1)-th input signal value is sent from the software simulator, first the history memory 22 is updated and thereafter, the mounted LSI 27 is driven by interrupt operation signals supplied from the interrupt operation signals memory 23, and the contents of the internal registers are saved in a similar manner as above. In this case, the internal status of the mounted LSI 27 is not needed so that the register store memory 24 is not updated. Then, a return interrupt instruction is supplied from the interrupt operation signals memory 23 to recover the (n)-th internal status stored in the register store memory 24. In this case, for those registers whose contents have been saved using an input pattern of a store instruction, an input pattern of a load instruction is supplied from the interrupt input signals memory 23 prior to the return interrupt instruction to thereby recover the contents of all the internal registers. Thereafter, the input signal values in the history memory 22 are used to drive the mounted LSI and obtain the resultant output corresponding to the (n+1)-th input signal value at the output latch 28.

As seen from the foregoing description, the internal status is set using an interrupt function of a microprocessor so that the history only between adjacent interruption operations is sufficient for simulation purpose. Further, the history is cleared at each interrupt operation so that the time necessary for executing the history does not become long because the length of the history is no more than 10 machine cycles of a microprocessor and the history memory capacity does not increase irrespective of the simulation time. Therefore, it is possible to simulate a logic circuit including circuits with unknown internal logic at a speed approximately of a real time speed, using a conventional software logic simulation.

In the foregoing description of the above embodiment, a microprocessor itself has been used as a circuit with unknown internal logic. However, the invention is not intended to be limited thereto, but obviously it is applicable to a general circuit with unknown internal logic.

According to the present invention, in performing logic simulation of an LSI with unknown internal logic on a printed circuit board unit, the LSI itself is used and the internal status is set using an interrupt operation. Therefore, it becomes possible to perform logic simulation readily and at high speed without any consideration of the history memory capacity and the history executing speed. Further, although actual device mounting submodules are needed for each objective LSI, such submodules can be implemented relatively easily, economically and readily even for new LSI's.

Although the save and recovery of the internal status during an interrupt operation is applicable to a microprocessor or other processors with an interrupt function, it is also possible to apply this invention to a logic circuit comprised of both circuit portions with and without microprocessors. In this case, the LSI's without microprocessors are subject to executing all the history from the start of simulation to set the internal status, whereas the LSI's with microprocessors are subject to executing the history only between adjacent interruption operations as described so far. Therefore, by mounting both LSI's with and without microprocessors on a single actual device mounting unit, it becomes possible to perform simulation of such a logic circuit using the actual LSI's with and without unknown internal logic.

Further, the application field of this invention is not limited to logic simulation but it is applicable to fault simulation by calling the apparatus of this invention by the software fault simulator.

We claim:

1. A logic simulation method for simulating a circuit including an actual device having an unknown circuit of unknown components and interconnections, comprising the steps of:

(a) generating a simulation input signal to be applied to said actual device for which an output of said unknown circuit is to be determined;
(b) recovering previously saved contents of internal registers of said actual device, said previously saved contents of said internal registers being contents previously held in said internal registers when said actual device was last operated;
(c) storing said recovered previously saved contents in said internal registers of said actual device;
(d) operating said actual device using said recovered previously saved contents stored in said internal registers so that said actual device responds to said generated simulation input signals;
(e) detecting an output of the actual device as a simulation output of the actual device;
(f) saving new contents of said internal registers resulting from operation of said actual device so that the saved new contents are used at a next execution of step (b); and
(g) repeating steps (a) to (f).

2. A logic simulation apparatus for a circuit including a first circuit, comprising:

logic simulation means for performing a logic operation of the first circuit based on a simulation circuit model thereof, so as to generate a first simulated output signal of said first circuit to be supplied to an actual device having a second circuit and internal registers;
register store means for holding previous contents of said internal registers of said actual device generated when said actual device was last operated; and
control means, connected to said logic simulation means and said register store means, for supplying the first simulated output signal to said actual device and for operating said actual device to generate a second simulated output signal in response to said first simultated output;
said control means including interrupt means for recovering previous contents of said internal registers held in said register store means, storing said previous contents in said internal registers before supplying said first simulated output signal to said actual device and for storing new contents of said internal registers in said register store means as previous contents of said internal register after operation of said actual device.

3. A logic simulation method for a circuit including first and second circuits, comprising the steps of:

(a) generating a simulated output signal of the first circuit to be supplied to the second circuit based on a simulation circuit model of the first circuit;
(b) recovering previous contents of predetermined internal registers included in an actual device realizing the second circuit, said previous contents being contents held in said internal registers when said actual device was last operated;
(c) storing said recovered previous contents of said internal registers in said internal registers;
(d) operating said actual device using said previous contents stored in said internal registers so that said actual device responds to the generated simulated output circuit;
(e) detecting output of the actual device and using said detected output as an input to the simulation circuit model at a next execution of step (a); and
(f) saving new contents of said internal registers resulting from operation of said actual device as previous contents so that the saved new contents are used at a next execution of step (b); and (g) repeating steps (a) to (f).

4. A logic simulation method according to claim 3, wherein the step (b) further includes a step of supplying a first interrupt request to said actual device together with said previous contents so that the previous contents are recovered and stored in said internal registers; and wherein step (f) further includes a step of supplying a second interrupt request to said actual device, and saving contents of said internal register supplied at output terminals of said actual device as a result of supply of the second interrupt.

* * * * *